United States Patent [19]

Taniguchi

[11] Patent Number: 5,162,140

[45] Date of Patent: Nov. 10, 1992

[54] FLEXIBLE PRINTED CIRCUIT BOARD AND COVERLAY FILM AND MANUFACTURE METHODS THEREFOR

[75] Inventor: Sakan Taniguchi, Tokyo, Japan

[73] Assignee: Nikkan Industries Co., Ltd., Tokyo, Japan

[21] Appl. No.: 731,151

[22] Filed: Jul. 15, 1991

Related U.S. Application Data

[62] Division of Ser. No. 514,022, Apr. 27, 1990, Pat. No. 5,084,124.

[30] Foreign Application Priority Data

Apr. 28, 1989 [JP] Japan ............................ 1-109491

[51] Int. Cl.5 .................. B32B 15/08; B32B 27/08; B32B 27/18; B32B 27/38; C09J 7/02
[52] U.S. Cl. ..................................... 428/40; 156/315; 174/259; 428/209; 428/336; 428/414; 428/416; 428/473.5; 428/901

[58] Field of Search ............... 156/315; 174/259; 428/473.5, 901, 336, 414, 416, 40

[56] References Cited

U.S. PATENT DOCUMENTS 5,084,124 1/1992 Taniguchi ....................... 156/315

Primary Examiner—James C. Cannon
Attorney, Agent, or Firm—Cushman, Darby & Cushman

[57] ABSTRACT

Disclosed herein is a flexible printed circuit board and coverlay film and a method for producing the same. The board and coverlay film have metal foil or parting paper adhered to a polyimide film using a two-layer thermosetting adhesive. The first layer of adhesive on the polyimide film is about 5 μm thick or less. The circuit board and coverlay film produced according to this invention have excellent bonding strength, thermal, chemical and weather resistance, as well as good insulating properties.

6 Claims, 1 Drawing Sheet

FLEXIBLE PRINTED CIRCUIT BOARD AND COVERLAY FILM AND MANUFACTURE METHODS THEREFOR

This is a division of application Ser. No. 07/514,022, filed Apr. 27, 1990, now U.S. Pat. No. 5,084,124.

BACKGROUND OF THE INVENTION

This invention relates to a flexible printed circuit board and a coverlay film. More particularly, it relates to a flexible printed circuit board and a coverlay film using polyimide film as insulator thereof and to manufacturing methods therefor.

In the prior art, a flexible printed circuit board is manufactured by using as an insulator, for example, a polyimide film, and attaching the same to a metal foil with an adhesive. The adhesives used for this purpose may be epoxy/nylon base adhesives or adhesives of epoxy resin/acrylonitrile butadiene rubber containing carboxyl group.

The flexible printed circuit boards have recently been widely used for appliances in telecommunications, and consumer and industrial appliances. As the packaging of those appliances becomes simpler, more compact, more reliable, and more highly functional, restrictions imposed on flexible printed circuit boards become extremely stringent. The boards are required to have high thermal resistance, good weatherability, electric insulation properties, bonding strength, and flexibility, and to meet severe conditions entirely different from those for glass epoxy board, ANSI grade, G-10 or FR-4.

More specifically, they are required to have thermal resistance and electric insulation properties as well as flexibility, and these are completely contradicting conditions. If emphasis is placed on flexibility, thermal resistance and electric insulation properties ordinarily must be sacrificed to some extent.

The aforementioned epoxy/nylon adhesives provide high bonding strength but the boards are inferior in electric insulation properties at a high humidity. The boards using adhesives of epoxy resin/acrylonitrile butadiene rubber containing carboxyl group are superior in bonding strength but inferior in thermal resistance. They are known to drastically deteriorate in bonding strength and flexibility when heated.

The above description of the prior art is applicable to a coverlay film which is used to protect circuits during processing of flexible printed circuit boards. In essence, the prior art flexible printed circuit boards and coverlay films known in the art cannot quite meet various conditions currently required of them.

SUMMARY OF THE INVENTION

An object of this invention is to obviate the aforementioned problems encountered in the prior art and to provide a flexible printed circuit board and a coverlay film that have excellent bonding strength, thermal resistance, chemical resistance, electric insulation properties, and flexibility as well as excellent moisture resistance and weatherability. This invention also aims to provide manufacturing methods therefor.

This invention provides a flexible printed circuit board and a coverlay film prepared by attaching metal foil or parting paper on a polyimide film with adhesives. The circuit board and coverlay fill of this invention have excellent bonding strength, thermal resistance, chemical resistance and electric insulation as well as moisture resistance and weatherability. Such excellent properties can be obtained by using adhesives in a dual-layer structure comprising a layer of a thermosetting adhesive A formed immediately upon the polyimide film in the thickness of ca. 5 $\mu$m or less and another layer of a thermosetting adhesive B formed on the layer of thermosetting adhesive A.

BRIEF DESCRIPTION OF THE DRAWING

FIG. 2 is a cross sectional view showing an embodiment of the structure of a coverlay film according to this invention. wherein:

1 . . . polyimide film
2 . . . thermosetting adhesive A
3 . . . thermosetting adhesive B
4 . . . metal foil
5 . . . parting paper

DETAILED DESCRIPTION

Figure 1:
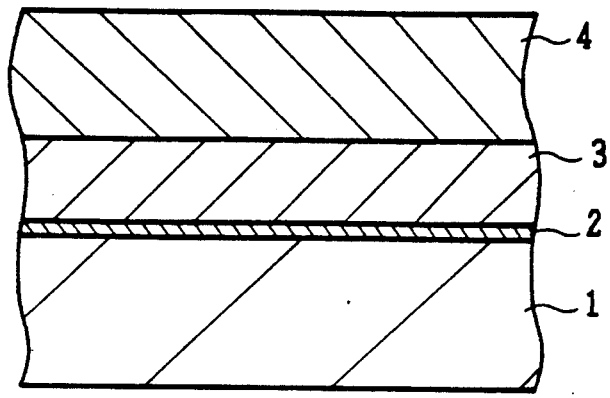
FIG. 1 is a cross sectional view showing an embodiment of a flexible printed circuit board according to this invention.
Figure 2:
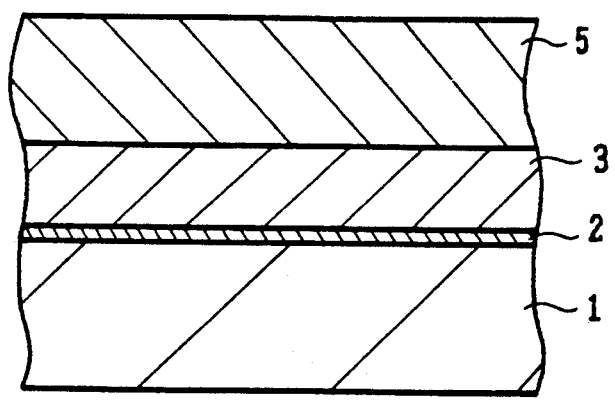

The present inventors discovered a superior flexible printed circuit boards and a method of manufacturing the same. As the structure is schematically shown in FIG. 1, polyimide film 1 is used as an electric insulating film. The process of this invention comprises the steps of applying and drying immediately upon the film a thermosetting adhesive A2 which comprises epoxy resin, polyamide resin, and amino compound having a thickness of ca. 5 $\mu$m or less when dried, applying and drying another thermosetting adhesive B3 comprising epoxy resin, acrylonitrile butadiene copolymer containing carboxyl group and aluminum hydroxide, attaching metal foil 4 thereon, applying heat and pressure, and then postcuring. As the structure is schematically shown in FIG. 2, the inventors also discovered that a desired coverlay film can be manufactured simply by replacing the metal foil 4 of FIG. 1 with a parting paper 5.

The flexible printed circuit board and coverlay film thus manufactured have excellent bonding strength, thermal resistance, weatherability, electric insulation properties and flexibility to the extent satisfying all the physical conditions required of a printed circuit material. Moreover, they are less susceptible to thermal deterioration, and have remarkably improved moisture resistance and weatherability.

Although FIG. 1 shows an embodiment in which a polyimide film is pasted with a metal foil only on one side thereof, this invention is applicable to boards with metal foil attached on both side surfaces.

The flexible printed circuit board and coverlay film according to this invention are characterized by both the dual layer structure of adhesives which comprises a thermosetting adhesive A formed immediately upon the polyimide film in the thickness of 5 $\mu$m or less and another thermosetting adhesive B formed on the thermosetting adhesive A.

The manufacturing method for flexible printed circuit board and for coverlay film according to this invention is characterized by the steps of applying and drying a thermosetting adhesive A on a polyimide film in the thickness of ca. 5 $\mu$m or less when dried, and then applying and drying a thermosetting adhesive B thereon.

The thermosetting adhesive A preferably is prepared by mixing 100 parts of epoxy resin, 5-50 parts of polyamide resin, 0-15 parts of amino compound and 0.1-0.5 part of tertiary amine. The thermosetting adhesive B preferably is prepared preferably by mixing 100 parts of epoxy resin, 40-160 parts of acrylonitrile butadiene copolymer containing carboxy group, 0-60 parts of aluminum hydroxide, 0-2.0 parts of zinc oxide, 4-15 parts of epoxy resin curing agent, and 0.2-1.0 part of curing catalyst. "Parts" refers to parts by weight.

As the epoxy resin used in the thermosetting adhesive A, an epoxy resin having 2 or more epoxy groups in one molecule is desirable. They may be bisphenol A epoxy resin, bisphenol F epoxy resin, novolak epoxy resin, polyglycidyl ether of carboxylic acid, urethane modified epoxy resin, or brominated epoxy resin. They are used singularly or in combination of two types.

Commercially available epoxy resins which may be used for the purpose are Epikote series (Shell Chemicals), Araldite series (CIBA Geigy), DER series (Dow Chemical), *Epiclon Series* (Dainippon Ink Chemical Industries).

The polyamide resin to be used in the thermosetting adhesive A is preferably an aliphatic amide/amine compound having an amide group which is crosslinked with epoxy group as a curing agent for liquid or solid epoxy resins.

Commercially available polyamide resins which are soluble in solvent may be used. They are Amilan CM 4000 and CM 8000 (by Toray), Polyamide series (Sanyo Kasei Kogyo) Versamid series (Daiichi General Sha), and Genamid series (Henkel Hakusui Sha).

As another curing agent for the thermosetting adhesive A, one or more than two of dicyandiamide, aliphatic amine compounds having tertiary amine as a curing catalyst, and aromatic amine imidazole may be added.

Those materials are dissolved in an organic solvent, which may be ketones, alcohols, or aromatic organic solvents, and are adjusted to have a solid content of 10-50%.

The thermosetting adhesive A is an epoxy-amino compound formed from epoxy resin, polyamide resin and two types of amino compounds as dicyandiamide, constituting a significant feature of this invention.

It is necessary to limit the thickness of the thermosetting adhesive A to ca. 5 $\mu$m or less. Unless limited within the range, it is not effective as a buffer agent and it therefore cannot achieve the intended object.

As the thermosetting adhesive B, all the epoxy resins which can be used as the adhesive A may be used.

The degree of polymerization of acrylonitrile butadiene copolymer containing carboxyl group to be used in this invention is not specified, but copolymers of medium to high molecular weight are preferable. Such copolymers are commercially available such as Nippol 1072 and 1072J (by Nippon Zeon), Hycar CTBN 1300XB, CTBN 1300X15 and CTBX 1300XB (BF Goodrich Chemicals).

The curing agent for the epoxy resin to be used for the thermosetting adhesive B may include aliphatic amines and aromatic amines. Preferably an aromatic amine such as diaminodiphenyl sulfone, diaminodiphenylmethane, or 2-dimethylaminomethyl phenol is used.

Salts with Lewis acid are preferable as the curing catalyst. Several non-limiting examples include a triethanolamine/ trifluoroboron complex, a hexylamine/trifluoroboron complex, and a monoethylamine/trifluoroboron complex.

As is obvious from the examples, the addition of fine particles of aluminum hydroxide to the adhesive B was found to be quite effective in improving bonding strength between the copper foil and the film after boiling, and/or the bonding strength after adding moisture.

A mixture of bromine compounds and antimony compounds is known as a fire retardant additive. The bromine compound may be pentabromobenzene, hexabromobenzene, tetrabromobenzene, hexabromodiphenyl ether, decabromodiphenyl ether, tetrabromo bisphenol A or dibromo glycidyl ether. The antimony compound may be antimony trioxide, antimony pentoxide, or sodium antimonate.

The polyimide film to be used for this invention may be Kaoton (DuPont), Unilex (Ube Industries) or Aoikal (Kanegafuchi Chemicals). Those films of which surface is treated for sand-matte finish or with plasma for improved bonding strength may be used similarly. The thickness may be about 18 $\mu$-125 $\mu$.

The flexible printed circuit board of this invention may be manufactured by the steps of applying, drying and curing a thermosetting adhesive A on a polyimide film in the thickness of 5 $\mu$m or less, applying and drying thereon a thermosetting adhesive B, pasting with, for instance, a copper foil at the B stage, either by contact-bonding with press or continuously with nip rollers, and curing with heat. This invention coverlay film which is used to protect the circuit may be manufactured by pasting a parting paper on the adhesive at the B stage before pasting the copper foil The flexible printed circuit board and coverlay film according to this invention are structured in dual layers comprising a thermosetting adhesive A which is formed in the thickness of ca. 5 $\mu$m or less on a polyimide film and a thermosetting adhesive B formed thereupon. The adhesive A acts as a buffer agent between the polyimide film and the thermosetting adhesive B, forming epoxyamino compound with for instance, epoxy resin, polyamide resin, and amino compound of two types of dicyandiamide compounds to enhance the bonding strength with the polyimide film and to improve properties particularly of moisture resistance and weatherability.

The thermosetting adhesive B may be prepared by mainly using the conventional materials which satisfy usual properties required for flexible printed circuit boards and coverlay film.

By the method mentioned above, it becomes possible to produce flexible printed circuit board and coverlay film which are excellent in bonding strength, thermal resistance, chemical resistance, electric insulation properties, flexibility and fire retardant property as well as moisture resistance and weatherability.

EXAMPLES

The Examples are solely illustrative and are by no means intended to restrict the scope of this invention.

Examples 1 through 5 for flexible printed circuit board

A thermosetting adhesive A was mixed and dissolved in methyl ethyl ketone/xylene=1 : 1 at the solid content of 15%, and applied on a 25 $\mu$m thick polyimide film to form a layer of the thickness of 3 $\mu$m. The layer was dried at 150° C. for 5 minutes. A thermosetting adhesive B was mixed and dissolved in methyl ethyl ketone/xylene=1 : 1 at the solid content of 30%, applied on the layer of thermosetting adhesive A in a thickness of 25 $\mu$m, dried at 120° C. for 5 minutes, bonded with a 35 $\mu$m thick copper foil with rollers using heat, and subjected to post-curing to produce a flexible printed circuit board with copper foil.

ability of the bonding, as well as in fire retardant characteristics.

TABLE

|  | comparative example 1 | comparative example 2 | comparative example 3 | Example 1 | Example 2 | Example 3 | Example 4 | Example 5 |
|---|---|---|---|---|---|---|---|---|
| Thermosetting adhesive A |  |  |  |  |  |  |  |  |
| Epikote 828 |  |  |  | 100 | 100 | 100 | 100 | 100 |
| Polyamide L-45-(3) (a polyamide) |  |  |  | 50 | 50 | 10 |  |  |
| Genamid 2000 (a polyamide) |  |  |  | 10 | 10 | 15 | 10 | 10 |
| dicyandiamide |  |  |  | 0.3 | 0.3 | 0.3 | 0.3 | 0.3 |
| benzyldimethylamine |  |  |  |  |  |  | 50 | 10 |
| Thermosetting adhesive B |  |  |  |  |  |  |  |  |
| Epikote 828 | 100 |  |  |  |  |  |  |  |
| DER 511 |  | 100 | 100 | 100 | 100 | 100 | 100 | 100 |
| Nippol 1072 | 100 | 100 | 100 | 100 | 50 | 150 | 150 | 100 |
| 4,4'-diaminodiphenylmethane | 10 | 10 | 10 | 10 | 10 | 10 | 10 | 10 |
| zinc oxide | 2 | 2 | 2 | 2 | 2 | 2 | 2 | 2 |
| aluminum hydroxide |  | 40 | 20 | 20 | 20 | 20 | 20 | 30 |
| hexabromobenzene |  |  | 20 | 20 | 20 | 20 | 20 | 20 |
| antimony trioxide |  | 10 | 10 | 10 | 10 | 10 | 10 | 10 |
| Evaluation of characteristics |  |  |  |  |  |  |  |  |
| bonding strength kg/cm |  |  |  |  |  |  |  |  |
| normal state | 2.1 | 2.0 | 2.0 | 2.0 | 2.0 | 2.4 | 1.9 | 2.0 |
| boiling 0-1/100 | 0.3 | 1.6 | 1.6 | 1.7 | 1.8 | 1.8 | 1.7 | 1.6 |
| chemical resistance $CH_2Cl_2$ for 5 min | 1.3 | 1.3 | 1.3 | 1.3 | 1.4 | 1.4 | 1.3 | 1.3 |
| long-term storage (2 yr) | 0.3 | 0.4 | 0.3 | 1.6 | 1.5 | 1.3 | 1.3 | 1.2 |
| weatherometer 600 hr | 0.3 | 0.4 | 0.3 | 1.1 | 1.1 | 1.0 | 1.0 | 1.1 |
| heating E-240/150 | 0.2 | 0.2 | 0.2 | 0.8 | 0.8 | 0.7 | 0.8 | 0.7 |
| soldering resistance 300° C. for 20 sec | accepted | accepted | accepted | accepted | accepted | accepted | accepted | accepted |
| normal state | $5.0 \times 10^{12}$ | $5.0 \times 10^{12}$ | $5.0 \times 10^{12}$ | $5.0 \times 10^{12}$ | $5.0 \times 10^{12}$ | $5.0 \times 10^{12}$ | $5.0 \times 10^{12}$ | $5.0 \times 10^{12}$ |
| electric insulation ($\Omega$) C-96/40/90 | $2.0 \times 10^{10}$ | $2.0 \times 10^{10}$ | $2.0 \times 10^{10}$ | $2.0 \times 10^{10}$ | $2.0 \times 10^{11}$ | $2.0 \times 10^{10}$ | $2.0 \times 10^{11}$ | $1.5 \times 10^{11}$ |
| fire retardant property UL-94VTM | not accepted | not accepted | accepted | accepted | accepted | accepted | accepted | accepted |

Epikote 828 by Shell Chemical
Polymide L-45-(3) by Sanyo Kasei Kogyo
DER 511 by Dow Chemical
Genamid 2000 by Henkel Hakusui
dicyandiamine by Nippon Carbide
Nippol 1072 by Nippon Zeon The bonding conditions were 130° C., 5 kg/cm, 0.5 sec., then the post-curing was conducted stepwise at 80° C. for 8 hours+120° C. for 8 hours +150° C. for 8 hours.

The compounding ratios of the thermosetting adhesives A and B were varied in 5 stages as shown in the Table for examples 1 through 5. The table shows the characteristics of the circuit boards obtained according to Examples 1-5.

Comparative Examples 1 through 3 for flexible circuit board

The three types of mixtures shown in the Table were mixed and dissolved in methyl ethyl ketone/xylene=1 : 1 at the concentration of 30%, and were processed in the manner similar to the examples 1 through 5 to manufacture flexible printed circuit boards with copper foil. The table shows the characteristics of the circuit boards produced.

As is obvious from the table, examples 1 through 5 were equal to or higher than comparative examples 1 through 3 in bonding strength under normal conditions, soldering resistance, and electric insulation properties and were superior to comparative examples 1 through 3 in thermal resistance, moisture resistance and weather-ability of the bonding, as well as in fire retardant characteristics.

Example 6 (Coverlay film)

A thermosetting adhesive A was mixed and dissolved in methyl ethyl ketone/xylene=1 : 1 at the solid content of 15%, and applied on a 25 μm thick polyimide film to form a layer of 3 μm thick. The layer was dried at 150° C. for 5 minutes. A thermosetting adhesive B was mixed and dissolved in methyl ethyl ketone/xylene=1 : 1 at the solid content of 30%, applied on the layer in the thickness of 30 μm, dried at 120° C. for 5 minutes, and press-bonded with a parting paper with rollers to produce a coverlay for protecting the circuit. The compounding ratios of the thermosetting adhesives A and B were identical to those of Example 1 in the table.

The parting paper was then peeled off, and a copper foil of the thickness of 35 μm was press-bonded using rollers. The layer was post-cured to produce a flexible printed circuit board with copper foil. The bonding was conducted at 130° C., 5 kg/cm², for 0.5 sec while the postcuring was conducted stepwise at 80° C. for 8 hours +120° C. for 8 hours+150° C. for 8 hours.

The flexible printed circuit board which was obtained showed characteristics similar to those obtained for Example 1 shown in Table. The coverlay lm of Example 6 was proven to sufficiently satisfy the requirements.

As described above, this invention uses a polyimide film as an electric insulation film, and the method of this invention comprises the steps of forming a dual-layer structure of a thermosetting adhesive A applied immediately on the polyimide film in the thickness of ca. 5 $\mu$m and a thermosetting adhesive B applied further thereon. The flexible printed circuit board and coverlay film for circuit protection thus manufactured have excellent thermal resistance, boiling resistance and weatherability. Furthermore, they exhibit extremely low decreases in bonding strength after heating and after testing with a weatherometer, as well as after boiling, and show excellent fire retardant properties.

What is claimed is:

1. An article of manufacture, comprising:
   a polyimide film,
   a first thermosetting adhesive layer having a thickness of about 5 $\mu$m or less attached to said polyimide film comprising an epoxy resin, a polyamide resin and an amino compound;
   a second thermosetting adhesive layer attached to said first layer comprising an epoxy resin, an acrylonitrile butadiene copolymer having at least one carboxyl group, and aluminum hydroxide,
   a third layer attached to said second thermosetting adhesive layer comprising metal foil or parting paper.

2. An article of manufacture according to claim 1, wherein said first thermosetting adhesive layer comprises:
   100 parts by weight of said epoxy resin,
   5-50 parts by weight of by weight of said polyamide resin,
   0-15 parts by weight of said amino compound, and
   further comprises 0.1-0.5 parts by weight of a tertiary amine.

3. An article of manufacture according to claim 2, wherein said second thermosetting adhesive layer comprises:
   100 parts by weight of said epoxy resin,
   40-160 parts by weight of said acrylonitrile butadiene copolymer,
   0-60 parts by weight of said aluminum hydroxide, and
   further comprising:
   0-2.0 parts by weight of zinc oxide,
   4-15 parts by weight of an epoxy resin curing agent, and
   0.2-1.0 parts by weight of a curing catalyst.

4. An article of manufacture according to claim 3, wherein, in said first thermosetting adhesive layer, said amino compound is dicyandiamide, said tertiary amine is benzyldimethylamine, and in said first and second thermosetting adhesive layers, said epoxy resin curing agent is an aromatic amine and said curing catalyst is a trifluoroboron complex.

5. An article of manufacture according to claim 1, wherein said article is a circuit board.

6. An article of manufacture according to claim 1, wherein said article is a coverlay.

* * * * *